US005715146A

United States Patent [19]

Hoppal

[11] Patent Number: 5,715,146

[45] Date of Patent: Feb. 3, 1998

[54] COMPUTER I/O EXPANSION BOARD SECURING APPARATUS AND METHOD

[75] Inventor: John Pete Hoppal, Fort Collins, Colo.

[73] Assignee: Hewlett-Packard Company, Palo Alto, Calif.

[21] Appl. No.: 609,253

[22] Filed: Feb. 29, 1996

[51] Int. Cl.[6] .......... H05K 7/12

[52] U.S. Cl. .......... 361/796; 361/740; 361/736; 361/683; 361/686; 174/138 G

[58] Field of Search .......... 361/740, 742, 361/44, 41, 56, 84, 90, 633, 36, 40, 736, 802, 683, 86; 174/138 G

[56] References Cited

U.S. PATENT DOCUMENTS 3,644,868 2/1972 Nevala .......... 339/17 LM
5,544,006 8/1996 Ratloff et al. .......... 361/683

*Primary Examiner*—Michael W. Phillips
*Assistant Examiner*—David Foster

[57] ABSTRACT

An apparatus securing at least first and second generally flat, rectangular I/O expansion boards in seated electrical connection with a mother board mounted in a computer card cage, wherein each expansion board has opposite first and second longitudinal edge portions and opposite first and second lateral edge portions and an electrical connector portion provided at the first lateral edge portion and wherein the electrical connector portion of each expansion board is matingly seated in an associated electrical connection portion of the mother board, and wherein the distance between the first and second lateral edge portions of the first expansion board is different from the distance between the first and second lateral edge portions of the second expansion board comprising a bracket assembly fixedly mounted with respect to said card cage and having a first surface portion disposed next adjacent to said second lateral edge portion of said first expansion board and a second surface portion disposed next adjacent to said second lateral edge portion of said second expansion board.

18 Claims, 9 Drawing Sheets

COMPUTER I/O EXPANSION BOARD SECURING APPARATUS AND METHOD

FIELD OF INVENTION

The present invention relates generally to computer input/output (I/O) expansion boards and, more particularly, to apparatus and method for securing such expansion boards in seated relationship with a mother board mounted in a computer card cage.

BACKGROUND OF INVENTION

Modern personal computers (PC's) are typically designed such that certain functionalities may be modularly added to the computer, as desired, by a user. One technique for modularly adding functionalities to a computer is use of I/O expansion boards. Such expansion boards may be "plugged in" to the base circuitry or "mother board" located inside the computer. I/O expansion boards may provide or enable such features as additional storage, additional memory, enhanced video, enhanced sound, network and other communication capabilities, etc. A mother board is typically provided within a portion of the housing known as a computer card cage. A card cage is designed to shield the electronics mounted therein from damage from the external environment and is also adapted to prevent escape of electromagnetic interference or EMI.

Computer card cages typically have openings in the rear thereof adapted to support one end of I/O expansion boards which are mounted within the card cage. The openings also allow the I/O expansion boards to interface with external devices.

I/O expansion boards typically comprise a flat, relatively stiff, rectangularly-shaped substrate having electronic circuit devices and leads provided on opposite flat surface portions thereof. A bulkhead is provided at one longitudinal end of the expansion board and acts to support that end of the expansion board at a rear panel opening of the computer card cage. An electrical connector portion, typically a male prong portion, is provided at one lateral edge of each expansion board and is adapted to be plugged into an associated socket on the mother board.

A problem often encountered in using I/O expansion boards is that, as a result of shipping or other movement of the computer board, the expansion board moves laterally away from the mother board causing the electrical connector portion on the expansion board to come unseated, and thus electrically disconnected, from the electrical connector portion of the mother board. This problem is exacerbated by the fact that all I/O expansion boards do not have the same lateral dimension. (This lateral dimension is sometimes referred to in the industry as the "height" of an expansion board because most computers are arranged so that the expansion boards are inserted into the computer with their lateral dimension oriented in a vertical plane. That dimension of an expansion board will generally be referred to herein as the "lateral dimension" or "width" rather than the "height".) Most modern PC's use expansion boards having standard dimensions as determined by the PCI standard. The most common expansion boards for PC's are ISA, EISA and PCI standard I/O expansion boards. Each of these boards has a different length and width as set forth in the standard. For example, the EISA standard I/O expansion board is wider and longer than the PCI standard expansion board. It is known in the art to mount a single flat wall surface or the like against a lateral edge of expansion boards having a constant width to prevent such expansion boards from unseating from a mother board. However, there is no prior art device which prevents unseating of multiple expansion boards having different widths.

A need exists for a device capable of maintaining multiple types of I/O expansion boards in seated relationship with a mother board. The apparatus should be capable of accommodating expansion boards of different widths and should also be capable of accommodating different mounting configurations of various types of expansion boards on a mother board.

SUMMARY OF INVENTION

This invention is directed to an apparatus for securing I/O expansion boards of different widths in seated electrical connection with a mother board mounted in a computer card cage. Each expansion board has an electrical connector portion provided at a lateral edge portion thereof. A bracket assembly is fixedly mounted with respect to the card cage. The bracket assembly has a first surface portion disposed next to a lateral edge portion of the first expansion board and a second surface portion disposed next to a lateral edge portion of the second expansion board. These surfaces of the bracket assembly prevent lateral displacement of the expansion boards and thus prevent unseating of the expansion boards from the mother board. The bracket assembly may include one or more laterally projecting adapter members that are mounted on a post member. A surface of the post member contacts expansion boards of one width and surfaces of the adapter members contact boards of a second width. The adapter members may be mounted at several different positions on the post member. Also, other adapters of different lateral dimensions may be used to accommodate boards of third and further different widths. Thus, variations in board width and board position on the mother board may be accommodated by the bracket assembly of the present invention.

BRIEF DESCRIPTION OF THE DRAWING

An illustrative and presently preferred embodiment of the invention is shown in the accompanying drawing in which.

DETAILED DESCRIPTION OF THE INVENTION

In General

Figure 6:
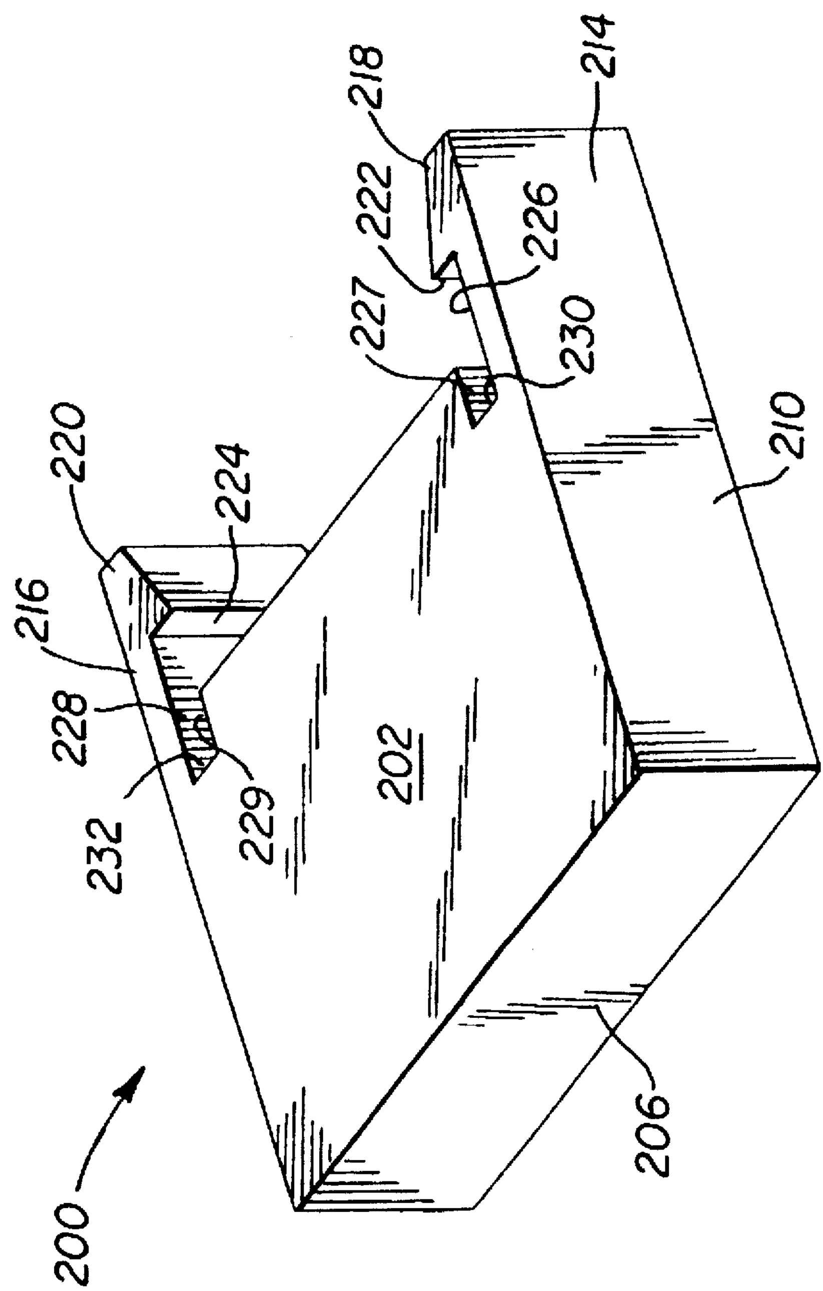
FIG. 6 is a top perspective view of an adapter member.
Figure 7:
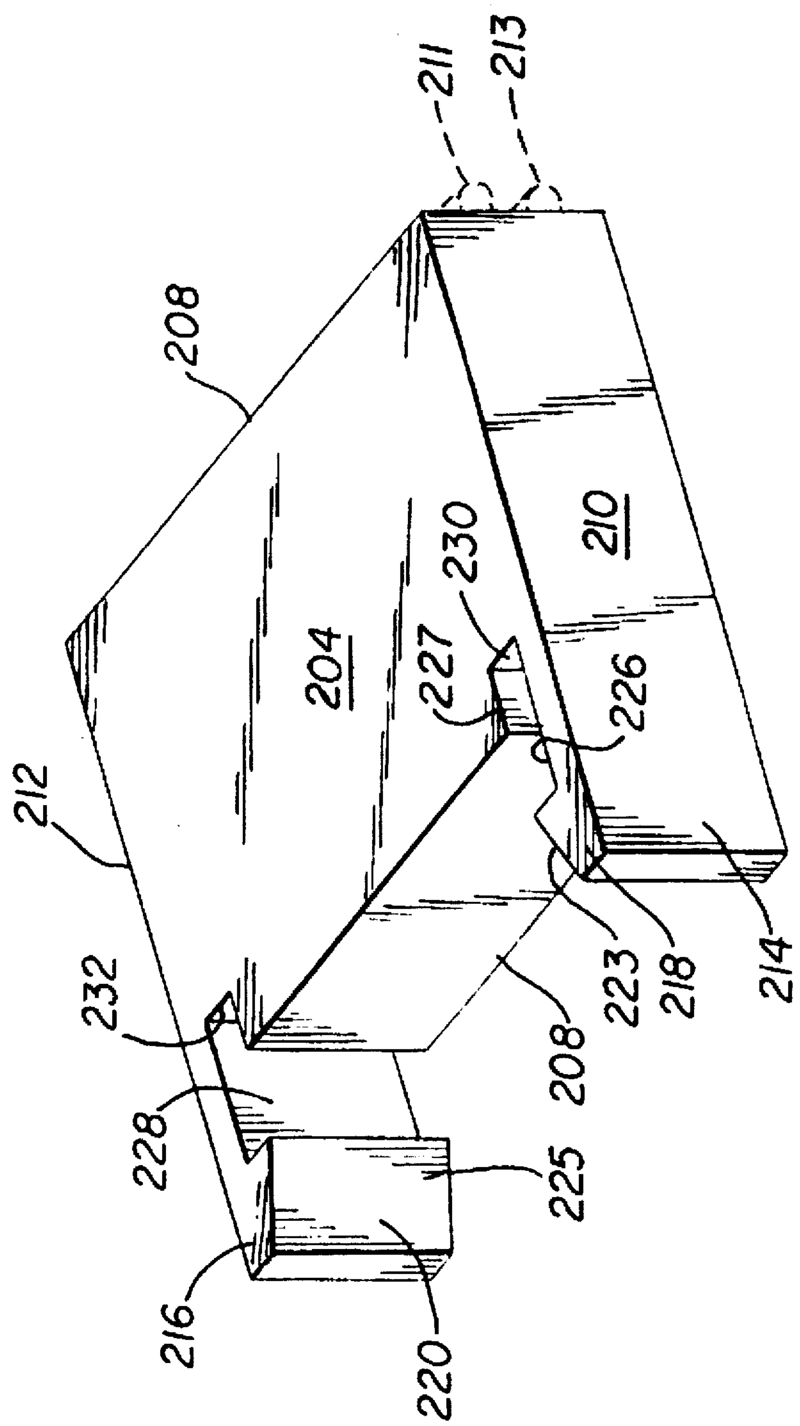
FIG. 7 is a bottom perspective view of an adapter member.
Figure 8:
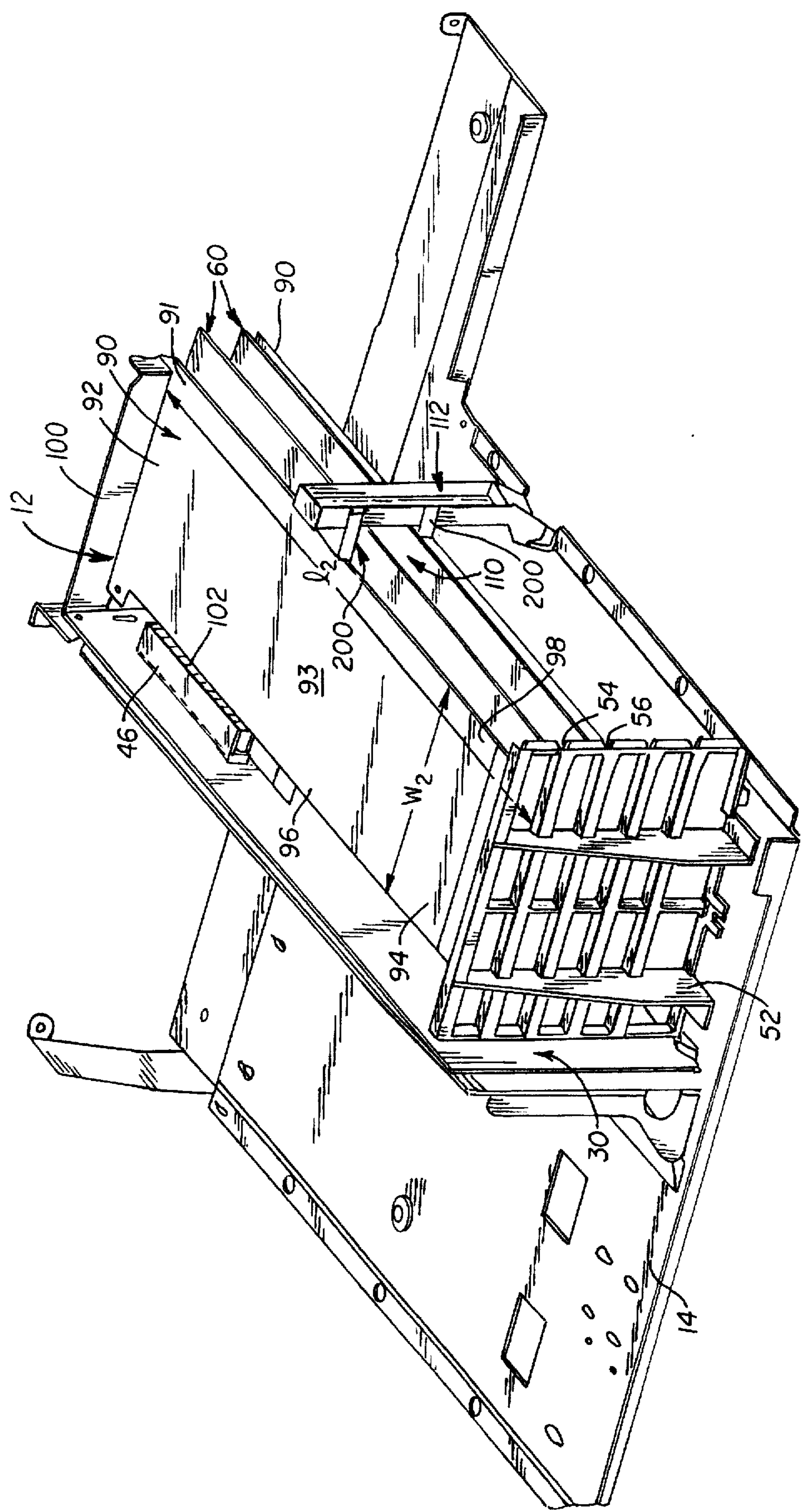
FIG. 8 is a perspective view of a computer card cage having I/O expansion boards mounted therein which are secured in position by a bracket assembly.

FIGS. 1–10, in general, disclose bracket assembly 110 for securing at least first and second, generally flat, rectangular I/O expansion boards 60, 90, FIG. 8, in seated electrical connection with a mother board 30 mounted in a computer card cage 12. Each expansion board has opposite first and second longitudinal edge portions 62, 64 and 92, 94, FIGS. 2 and 8, and opposite first and second lateral edge portions 66, 68 and 96, 98, FIGS. 2 and 4, and an electrical connector portion 72, 102 provided at the first lateral edge portion. The electrical connector portion 72, 102 of each expansion board is matingly seated in an associated electrical connection portion 46, 48, FIGS. 1, 9 and 10, of the mother board. The distance $w_1$ between the first and second lateral edge portions 66, 68 of the first expansion board 60 is different from the distance $w_2$, FIG. 8, between the first and second lateral edge portions 96, 98 of the second expansion board 90. The bracket assembly 110 is fixedly mounted with respect to the card cage 12. The bracket assembly 110 has a first surface portion 156 disposed next adjacent to the second lateral edge portion 68 of the first expansion board 60, FIGS. 4 and 5. The bracket assembly has a second surface portion 206 disposed next adjacent to the second lateral edge portion 98 of the second expansion board 90.

FIGS. 1–10, in general, also illustrate a method for securing at least first and second generally flat, I/O expansion boards 60, 90, which have different lateral dimension, in seated electrical connection with a mother board 30 mounted in a computer card cage 12. The method includes the step of limiting lateral displacement of a lateral edge portion 68 of the first expansion board 60 with a post member 112, FIG. 4, so as to prevent the first expansion board 60 from unseating from the mother board. The method also includes the step of limiting lateral displacement of a lateral edge portion 98 of the second expansion board 90 with an adapter member 200 so as to prevent the second expansion board 90 from unseating from the mother board 30.

Card Cage and Motherboard

Figure 1:
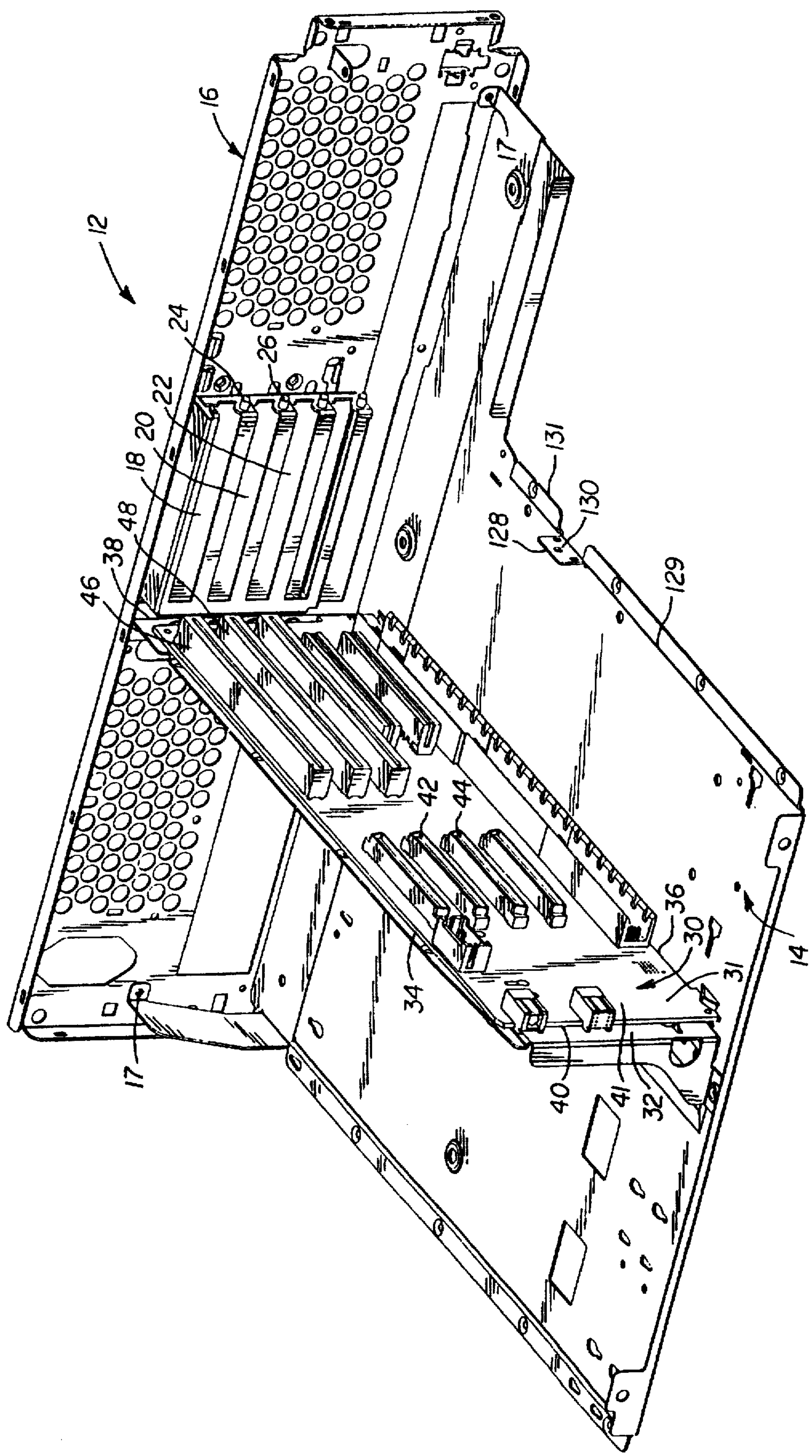
FIG. 1 is a perspective view of a computer card cage.

Having thus described an I/O expansion board securing bracket assembly in general, the bracket assembly and its use environment will now be described in further detail. FIG. 1 illustrates a computer card cage 12 which includes a generally flat main tray 14 having a first central plane and a generally flat rear panel 16 having in a second central plane perpendicular to the central plane of the main tray 14. The rear panel 16 may be attached to the main tray as by mounting screws 17 and/or other conventional attachment means. The main tray 14 in the embodiment disclosed in FIG. 1 is positioned in a horizontal plane. However, in many modern computers configured in a "tower"-type arrangement, a main tray portion of the card cage might be configured in a vertical orientation. It is thus to be understood that designations of horizontal and vertical and similar terminology indicating a gravitational plane of reference are merely used for descriptive purposes and are not to be construed to limit the scope of the invention. The rear panel 16 is provided with a plurality of axis slots 18, 20, 22, etc. which, in the embodiment of FIG. 1, extend horizontally. Card bulkhead attachment members such as bullet-shaped studs 24, 26, etc. are provided for mounting card bulkhead members in covering relationship with the access slots 18, 20, 22, etc. Various other types of card bulkhead attachment members are also employed in the art such as, for example, conventional screws and the like.

A mother board 30 which includes a relatively stiff, flat, rectangularly-shaped substrate portion 31 is attached by conventional means such as screws or the like to a conventional back-plane support bracket 32. The back-plane support bracket is, in turn, attached to main tray 14 and rear panel 16 by conventional attachment means such as screws and the like. The mother board 30 and back-plane support bracket 32 are both oriented perpendicular to the plane of the main tray and perpendicular to the plane of the rear panel. The mother board has a first lateral edge portion 34 disposed distal the main tray, a second lateral edge portion 36 disposed proximate the main tray 14, a first longitudinal end portion 38 disposed proximate rear panel 16 and a second longitudinal end portion 40 disposed distal rear panel 16. A front face 41 of the mother board has electrical connector portions 42, 44, 46, 48, etc. disposed thereon. The electrical connection portions may be adapted to accommodate different types of I/O expansion boards. For example, connector portion 46 may be adapted to accommodate a PCI-type expansion board and electrical connection portion 48 may be adapted to accommodate an EISA-type expansion board. Mother boards, of course, differ in configuration depending upon the type and mounting configuration of expansion boards which are adapted to be mounted on the motherboard. The bracket assembly 110 described below is adapted to be used with such various expansion board configurations rather than only a single expansion board configuration of preset design.

As illustrated in FIG. 8, card cage 12 may also comprise a card guide 52 having a plurality of card guide slots 54, 56, etc. The card guide extends generally parallel to the plane of rear panel 16 and the card guide slots 54, 56, etc. therein also extend parallel to this plane and perpendicular to the plane of the mother board. The slots 54, 56, etc. have a relatively short longitudinal dimension and short vertical dimension which is sufficient to allow an end portion of an associated I/O expansion board to be slidingly received therein and supported thereby. However, depending upon the size of expansion board used, the expansion board may or may not be long enough to be received in such card guide slots.

EISA I/O Expansion Board

Figure 2:
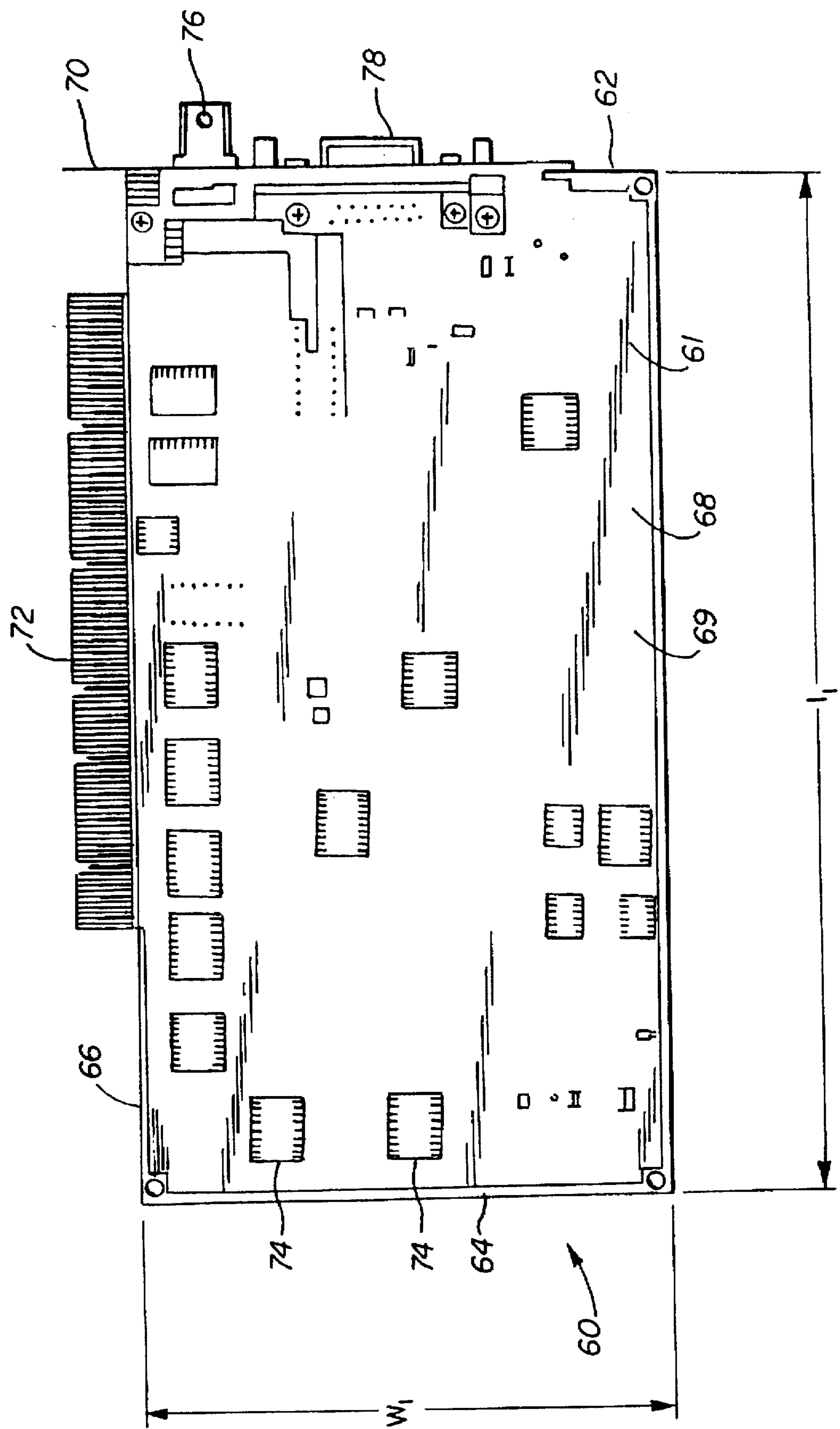
FIG. 2 is a top plan view of an EISA I/O expansion board and associated bulkhead.

FIG. 2 is a top plan view of an EISA-type I/O expansion board 60. Such an expansion board includes a generally flat, rectangularly-shaped substrate 61 having a first longitudinal edge portion 62, a second longitudinal edge portion 64, a first lateral edge portion 66, and a second lateral edge portion 68. The substrate has a flat bottom surface 67, FIG. 4, and a flat top surface 69. A bulkhead 70 which may comprise a generally rectangularly-shaped plate with various projections thereon is attached to the expansion board proximate the first longitudinal edge portion 62 by conventional means well known in the art. An electrical connector portion 72, which for EISA and PCI and ISA expansion boards is a male connector portion, is provided at the first lateral edge portion 66 of the expansion board. Various circuit devices 74 and connecting circuitry are provided on the top surface 69 of the substrate and similar circuit devices and circuitry (not shown) is provided on the bottom surface 67. Electrical adapters 76, 78 provided on bulkhead 70 enable the circuitry on the I/O expansion board and through it, the circuitry on the mother board, to be electrically connected to external devices. An EISA expansion board has a preset width "$w_1$" which, as previously mentioned, is sometimes referred to in the industry as the height of the expansion board. The EISA expansion board also has a present length "$1_1$". Various other dimensioning of the EISA I/O expansion board such as dimensions of the electrical connector portions 72, etc. are the subject of well-known industry standards.

PCI-Type Expansion Board

Figure 4:
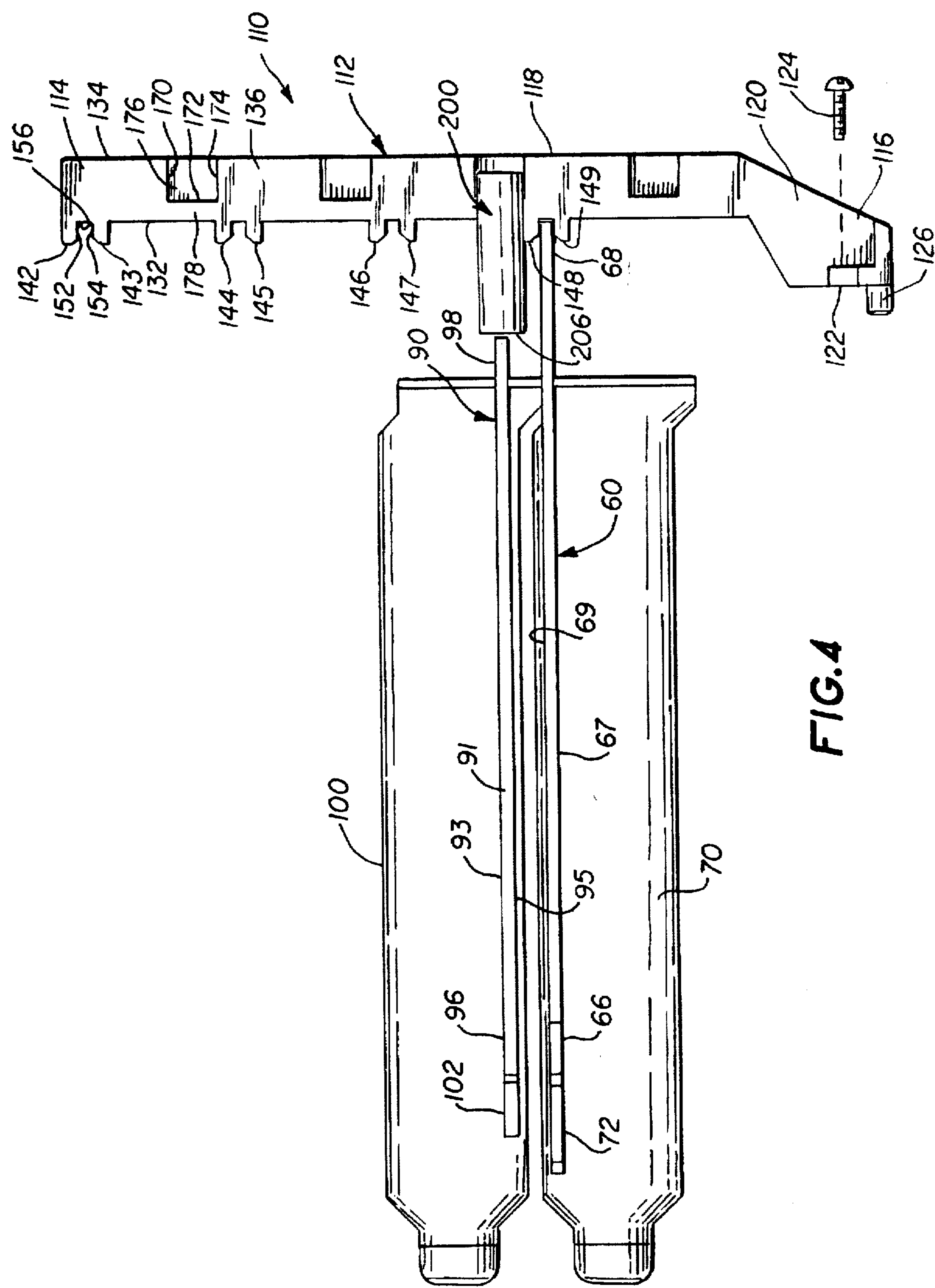
FIG. 4 is a side elevation view of a bracket assembly 110 and two I/O expansion boards secured thereby, and associated expansion board bulkheads.

A PCI-type expansion board 90 is illustrated schematically in FIGS. 4 and 8. The PCI-type I/O expansion board is generally similar to the EISA-type I/O expansion board and includes a generally rectangularly-shaped substrate 91 having a flat top surface 93 and a flat bottom surface 95 with electronic circuitry (not shown) provided thereon. The substrate has a generally flat, rectangular shape with a first longitudinal edge portion 92, a second longitudinal edge portion 94, a first lateral edge portion 96, and a second lateral edge portion 98. A bulkhead 100 is conventionally mounted at the first longitudinal edge portion 92 of the PCI-type expansion board 90 and may have the same general characteristics as the bulkhead 70 of the EISA-type I/O expansion board. An electrical connector portion 102 is provided at the first lateral edge portion 96 of the expansion board substrate and is adapted to matingly seat with a corresponding portion 46 of the mother board 30 as illustrated in FIG. 8. The PCI-type expansion board has a lateral dimension or width "$w_2$" which is smaller than the width "$w_1$" of the EISA-type expansion board. The PCI-type expansion board also comprises a length "$1_2$" which is shorter than the length "$1_1$" of the EISA-type I/O expansion board. The specific configurations of the EISA-type I/O expansion board and PCI-type expansion board are set forth in detail in PCI and EISA standards which also describes the standards for other expansion boards and which are hereby incorporated by reference for all that is disclosed therein.

Bracket Assembly—Post Member

A bracket assembly 110 for maintaining expansion boards 60, 90, etc. in seated relationship with a mother board 30 is shown in FIGS. 3–8. The bracket assembly includes a post member 112, best shown in FIGS. 3–5 which may be constructed from plastic or metal or a combination of plastic and metal or other relatively high-strength material. The post member has a top end 114 and a bottom end 116. The bracket assembly includes a straight portion 118 integrally formed with a inwardly-extending foot portion 120. A screw-accepting portion 122 adapted to accept a screw 124, FIG. 4, is provided in foot portion 120. Toe portions 126, FIG. 5, project outwardly from foot portion 120. Toe portions 126, 127 serve as locators for positioning the post member 110 in proper vertical relationship with respect to main tray 14, FIG. 1. A flange portion 128 on main tray 14, FIG. 1, projects vertically upwardly from the plane of the tray and is spaced inwardly from flat flanges 129, 131 which are used to attach the main tray to other portions of the computer housing. Such other portion of the computer housing may comprise a vertically upright wall portion (not shown) which abuts a rear surface portion 134 of the bracket assembly 110 providing further lateral stability thereto. Toe portions 126, 127 vertically orient the post member 112 relative to flange 128 and the edges of wall portions 129, 131 serve to horizontally locate the post member opposite flange portion 128 with screw-accepting hole portion 122 of the post member 112 aligned with screw hole 130 in the flange portion 128. Thus, the bracket assembly 110 is easily positioned next to and attached to the flange portion 128 by screw 124 or similar attachment device.

Figure 3:
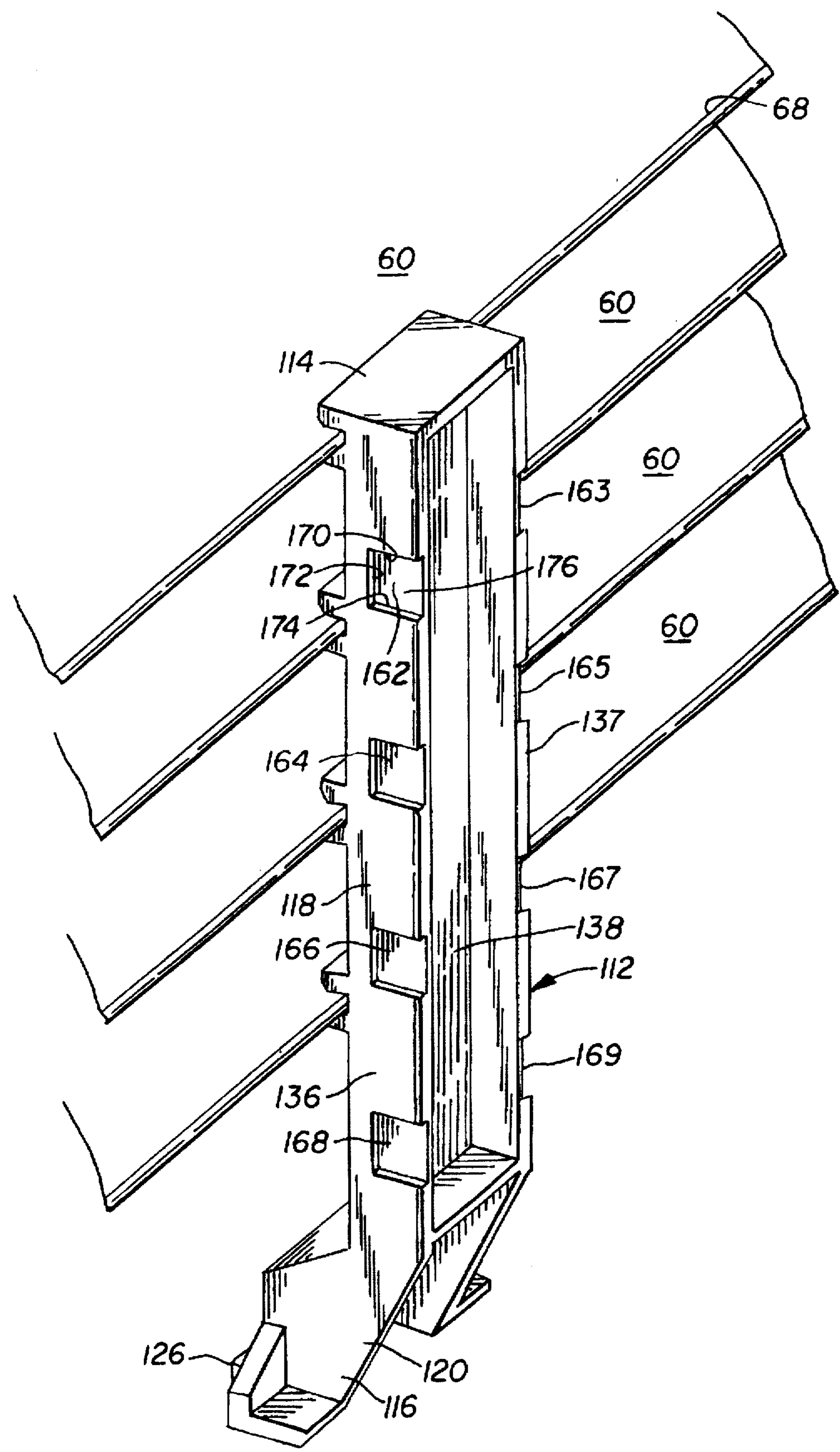
FIG. 3 is a perspective view of a support bracket assembly post member and portions of I/O expansion boards supported thereby.

The post member 112 has a front surface portion 132, a rear surface portion 134, a first lateral surface portion 136 and an opposite lateral surface portion 137, FIG. 3, which may be a mirror image of surface portion 136. The post member 112 may be a channel member having an open rear cavity 138 as best illustrated in FIG. 3. In one preferred embodiment, the distance between front and rear surface portions 132 and 134 may be 7.85 millimeters and the distance between first and second lateral surface portions 136, 137 may be 20.0 millimeters. The overall height of the post member may be 109.3 millimeters. The height of the foot portion may be 19 millimeters and the distance between front surface 121 of the foot portion and front surface 132 of the straight portion 118 may be 9.6 millimeters.

A plurality of lip pairs 142, 143; 144, 145; 146, 147; and 148, 149 project outwardly a short distance, e.g., 3.0 millimeters, from front surface portion 132. Each lip pair comprises an upper and lower inner horizontal abutment surface 152, 154. Each lip pair also comprises an inner, vertical abutment surface 156 which in one preferred embodiment is coplanar with front surface 132, as best shown in FIG. 4. In one embodiment in which the lip pairs are adapted to accommodate an EISA-type expansion board, the spacing between surfaces 152 and 154 is 19.05 millimeters. The lip pairs may serve to prevent vertical travel of the outer lateral edge portion 68 of an associated expansion board and the inner vertical abutment surface 156 may serve to prevent lateral displacement and thus prevent unseating of an associated expansion board 60.

Figure 5:
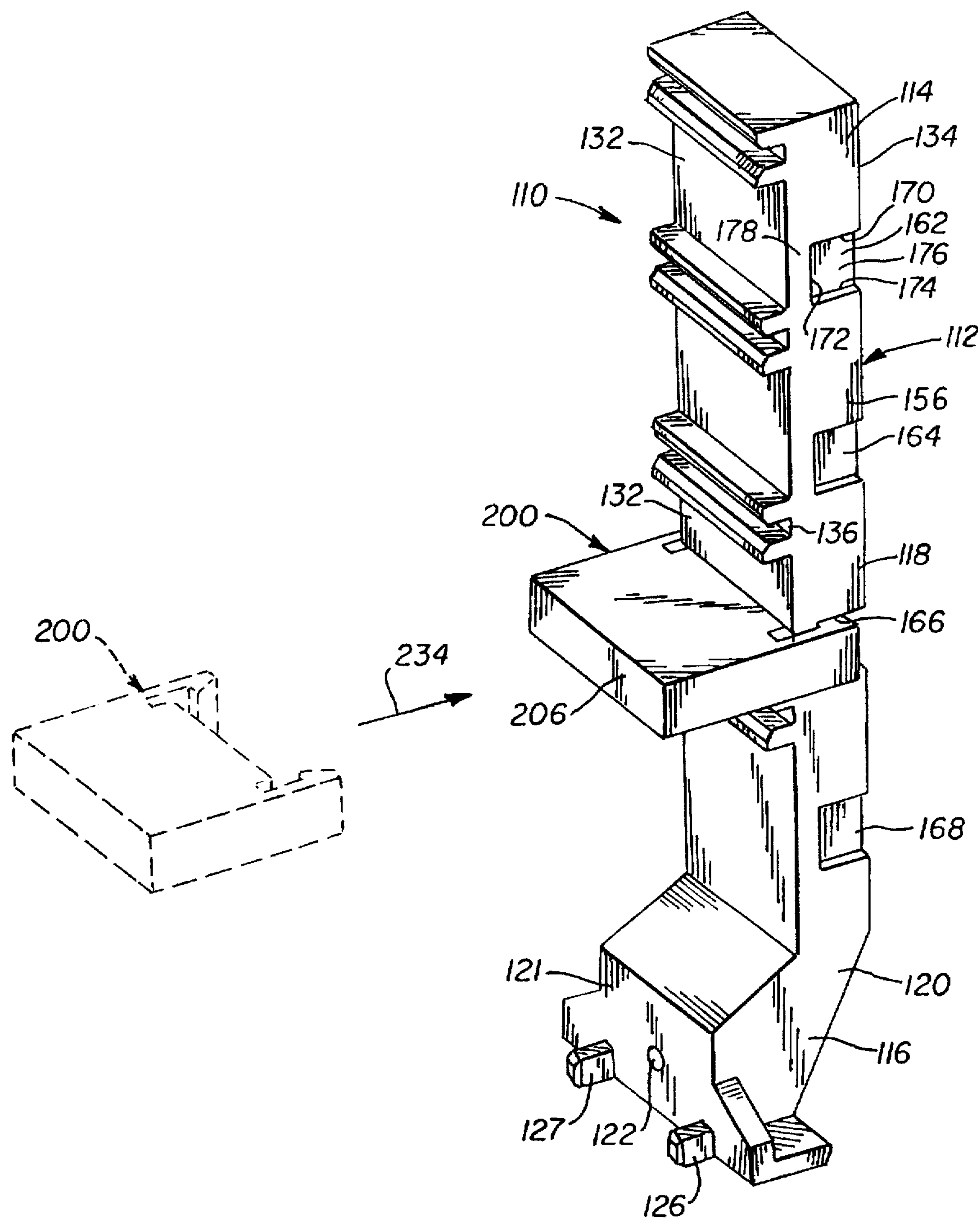
FIG. 5 is a perspective view of a bracket assembly illustrating the method of mounting of an adapter member on a post member.

The post member 112 comprises a plurality of adapter recesses 162, 164, 166, 168 which are recessed from first lateral surface portion 136, FIG. 5, and mirror image adapter recesses 163, 165, 167, 169 recessed from second lateral surface portion 137, FIG. 3. Each adapter recess may be generally rectangular in shape and may comprise ledge surfaces 170, 172, 174 and planar surface 176, FIGS. 3 and 5. A narrow bridge portion 178, FIG. 5, separates each recess from the front surface portion 132 of the post member. In one preferred embodiment, the depth of each ledge surface 170, 172, 174 is 1.2 millimeters, the height of each recess is 6.6 millimeters and the distance between the terminal edge of the recess and the forward ledge surface 172 is 5.35 millimeters. The width of bridge portion 178, i.e., the distance between the front surface portion 132 and the associated adapter recess ledge 172, is 2.5 millimeters.

Bracket Assembly—Adapter Member

Adapter member 200 of bracket assembly 110 is best illustrated in FIG. 6, showing a top perspective view thereof and FIG. 7, showing a bottom perspective view thereof. Each adapter member 200 comprises a top face 202, a bottom face 204, a first end face 206, a second end face 208, a first lateral side face 210 and a second lateral side face 212 which may be a mirror image of the first lateral side face. Each adapter member 200 has first and second resilient arm portions 214, 216 having first and second inwardly extending hand portions 218, 220 integrally formed therewith. The hand portions, in turn, have first and second abutment surfaces 222, 224 provided thereon. The arms are defined in part by first and second arm inner surfaces 226, 228 which are parallel and spaced inwardly from inner cutout surfaces 227, 229. Arm inner surfaces 226, 228 are connected to surfaces 227, 229 respectively, by surfaces 230, 232, respectively. Surfaces 230, 232 may be spaced e.g. 2.0 millimeters from face 208. Face 208 may be spaced eg., 2.85 millimeters from the hand abutment surfaces 222, 224. The distance between surfaces 226, 228 may be e.g., 21.0 millimeters. The distance from second end face 208 to the outer terminal end of each hand portion may be 5.85 millimeters. The distance between faces 210 and 212 may be e.g., 24.0 millimeters. The distance between top and bottom faces 202, 204 may be, e.g. 6.0 millimeters. The distance of the terminal edge of each abutment surface 222, 224 from surfaces 226, 228, respectively may be e.g., 1.2 millimeters, a distance which is preferably less than the depth of each recess 162, 164, 166 etc. of post member 112. Each adapter member 200 is preferably constructed from a resilient material such as plastic. Adapter member hand portions also comprise first and second beveled surface portions 223, 225 which are adapted to be urged in direction 234 against edge portions of the post member. This causes the associated arm portions of the adapter member 200 to be urged outwardly until the associated abutment surfaces 222, 224 of the respective hand portions clear the vertical ledge portion 172 of the associated recess. At this point the elastic memory of the arm portions cause them to deflect inwardly and lock the adapter member 200 into fixed relationship with the post member with the second end face surface 208 thereof positioned in abutting relationship with the front surface portion 132 of the post member 112.

From the above description and the drawings, it will be appreciated that each adapter member 200 is adapted to "snap" into an associated recess pair, e.g. 166, 167 of post member 112, and after snapping into the associated recesses is adapted to be maintained in outwardly cantilevered relationship therewith.

Lip portions 211, 213, shown in phantom in FIG. 7, which are similar or identical to those on the post member may be provided on adapter members which are designed to be used with I/O expansion boards which do not have electrical circuitry provided near a terminal edge portion of the expansion board and similarly that the lip portions on the post member might desirably be removed if the abutment surface on the most member is to be positioned opposite an expansion board of the type having circuitry provided extremely close to the edge portion of the expansion board.

Seating

Figure 9:
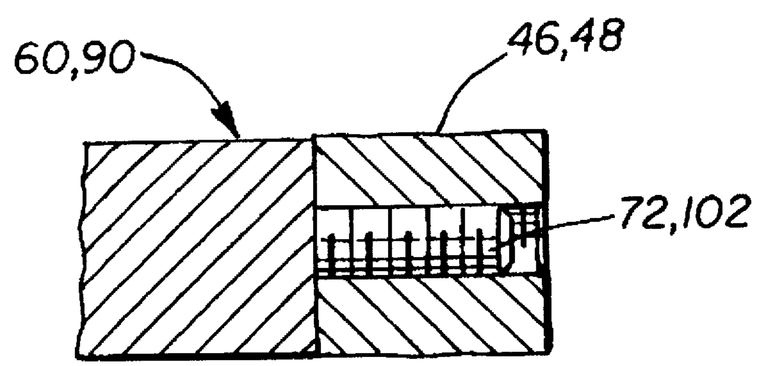
FIG. 9 is a detail cross-sectional view of a mother board electrical connector portion and an associated I/O expansion board electrical connector portion mounted in seated relationship therewith.
Figure 10:
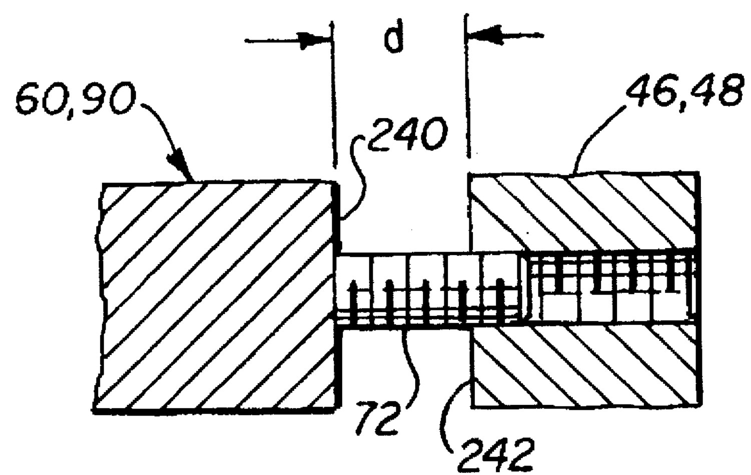
FIG. 10 is detail cross-sectional view of a mother board electrical connector portion and an associated I/O expansion board electrical connector portion mounted in unseated, electrically-disconnected relationship therewith.

FIG. 9 is a schematic detail cross-sectional view of an expansion board, e.g., 60 or 90, having the electrical connector portion e.g. 72, 102 thereof fully inserted into the electrical connector portion e.g. 46, 48 of mother board 30. In this position, the expansion board is fully seated in the mother board such that the I/O expansion board is in functional electrical connection with the mother-board. FIG. 10 is identical to FIG. 9 except that the I/O expansion board 60 or 90 has been moved laterally outwardly a distance "d" from the mother board. At distance "d", the mother board and associated I/O expansion board are no longer in electrical connection and thus, the I/O expansion board is said to be in "unseated" relationship with the mother board. The distance "d" is the distance where this unseating initially occurs. The distance "d" may be measured, for example, between a terminal edge surface 240 of the card substrate and an associated abutment surface 242 of the connector board which is in contact with surface 240 in the fully seated position. This distance "d", the lateral distance required to cause a fully-seated I/O expansion board to become electrically disconnected, is greater than the distance between the outer face surface 156 of the post member and an associated terminal edge surface of a lateral edge portion 68 of an oppositely-positioned expansion board 60 when the post member 112 is mounted on tray 14 as previously described. The distance "d" is also greater than the distance between the terminal edge surface of a lateral edge portion 98 of an expansion board 90 and an oppositely-positioned face 206 of an adapter member 200 which is mounted on the post member 112. In one preferred embodiment, the spacing between the terminal edge of an expansion board and an oppositely positioned abutment surface 156, 206 of post member 112 and adapter member 200, respectively, is less than one-half "d", and most preferably less than one-fourth "d". In a typical configuration, the distance "d" may be approximately 2 to 4 millimeters and the most preferred spacing between terminal edge portions of a board and an oppositely positioned abutment surface portion of the bracket assembly 110 is less than 1 millimeters.

It is contemplated that the inventive concepts herein described may be variously otherwise embodied and it is intended that the appended claims be construed to include alternative embodiments of the invention except insofar as limited by the prior art.

What is claimed is:

1. An apparatus securing at least first and second generally flat, rectangular I/O expansion boards in seated electrical connection with a mother board mounted in a computer card cage, wherein each expansion board has opposite first and second longitudinal edge portions and opposite first and second lateral edge portions and an electrical connector portion provided at the first lateral edge portion and wherein the electrical connector portion of each expansion board is matingly seated in an associated electrical connection portion of the mother board, and wherein the distance between the first and second lateral edge portions of the first expansion board is different from the distance between the first and second lateral edge portions of the second expansion board comprising a bracket assembly fixedly mounted with respect to said card cage and having a first surface portion disposed next adjacent to said second lateral edge portion of said first expansion board and a second surface portion disposed next adjacent to said second lateral edge portion of said second expansion board.

2. The apparatus of claim 1:

(a) wherein said first expansion board is of a type having:
  (i) an electrically seated state with a respect to said mother board when a terminal edge portion of said electrical connector portion of said first expansion board is positioned within a first predetermined mating distance of an associated abutment surface of said mother board; and
  (ii) an electrically unseated state with respect to said mother board when a terminal edge portion of said electrical connector portion of said first expansion board is positioned more than said first predetermined mating distance from an associated abutment surface of said mother board; and (b) wherein said first surface portion of said bracket assembly is positioned less than said first predetermined mating distance from said second lateral edge portion of said first expansion board.

3. The apparatus of claim 1:

(a) wherein said second expansion board is of a type having:
  (i) an electrically seated state with respect to said mother board when a terminal edge portion of said electrical connector portion of said second expansion board is positioned within a second predetermined mating distance of an associated abutment surface of said mother board; and
  (ii) an electrically unseated state with respect to said mother board when a terminal edge portion of said electrical connector portion of said second expansion board is positioned more than said second predetermined mating distance from an associated abutment surface of said mother board; and (b) wherein said second surface portion of said bracket assembly is positioned less than said second predetermined mating distance from said second lateral edge portion of said second expansion board.

4. The apparatus of claim 2:

(a) wherein said second expansion board is of a type having:

(i) an electrically seated state with respect to said mother board when a terminal edge portion of said electrical connector portion of said second expansion board is positioned within a second predetermined mating distance of an associated abutment surface of said mother board; and (ii) an electrically unseated state with respect to said mother board when a terminal edge portion of said electrical connector portion of said second expansion board is positioned more than said second predetermined mating distance from an associated abutment surface of said mother board; and (b) wherein said second surface portion of said bracket assembly is positioned less than said second predetermined mating distance from said second lateral edge portion of said second expansion board.

5. The apparatus of claim 1, said bracket assembly comprising a bracket member and an adapter member mounted on said bracket member, and wherein said first surface portion of said bracket assembly is on said bracket member and said second surface portion of said bracket assembly is on said adapter member.

6. The apparatus of claim 5 wherein said bracket member is a post member positioned at a location adjacent said second lateral edge portions of said extension boards and between said first and second longitudinal edge portions of said extension boards.

7. The apparatus of claim 6, said post member comprising a plurality of adapter mounting portions, said adapter being mounted at one of said plurality of adapter mounting portions.

8. The apparatus of claim 7, said post member comprising a plurality of lip pairs including a first lip portion and a second lip portion projecting from said first surface portion, said lip pairs being positioned at regular intervals along said post member and alternating with said adapter mounting portions.

9. The apparatus of claim 1, said bracket assembly comprising a first lip portion and a second lip portion projecting from one of said first surface portion and said second surface portion and disposed opposite a first and second side, respectively, of one of said first extension board and said second extension board.

10. An apparatus for securing at least first and second generally flat, I/O expansion boards having different lateral dimension in seated electrical connection with a mother board mounted in a computer card cage comprising:

post means fixedly mounted with respect to said card cage for co-acting with a lateral edge portion of said first expansion board for preventing said first expansion board from unseating from said mother board; and adapter means removably mounted on said post means for co-acting with a lateral edge portion of said second expansion board for preventing said second expansion board from unseating from said mother board.

11. The apparatus of claim 10 wherein said post means comprises means for supporting said adapter means at a plurality of locations thereon.

12. The apparatus of claim 10, further comprising expansion card support means provided on at least one of said post means and said adapter means for supporting an associated one of said expansion boards in at least one direction perpendicular to a central plane of said associated expansion board.

13. A method for securing at least first and second generally flat, I/O expansion boards having different lateral dimension in seated electrical connection with a mother board mounted in a computer card cage comprising limiting lateral displacement of a lateral edge portion of said first expansion board with a post member so as to prevent said first expansion board from unseating from said mother board and limiting lateral displacement of a lateral edge portion of said second expansion board with an adapter member mounted on said post member so as to prevent said second expansion board from unseating from said mother board.

14. The method of claim 13 comprising the further step of supporting said adapter member at one of a plurality of adapter mounting locations on said post member.

15. The method of claim 14, comprising the further step of supporting at least one of said expansion cards with at least one of said post member and said adapter member in at least one direction perpendicular to a central plane of said associated expansion board.

16. An apparatus securing at least first and second generally flat, rectangular I/O expansion boards in seated electrical connection with a board previously mounted in a computer card cage, wherein each expansion board has opposite first and second longitudinal edge portions and opposite first and second lateral edge portions and an electrical connector portion provided at the first lateral edge portion and wherein the electrical connector portion of each expansion board is matingly seated in an associated electrical connection portion of the previously mounted board, and wherein the distance between the first and second lateral edge portions of the first expansion board is different from the distance between the first and second lateral edge portions of the second expansion board comprising a bracket assembly fixedly mounted with respect to said card cage and having a first surface portion disposed next adjacent to said second lateral edge portion of said first expansion board and a second surface portion disposed next adjacent to said second lateral edge portion of said second expansion board.

17. An apparatus for securing at least first and second generally flat, I/O expansion boards having different lateral dimension in seated electrical connection with a board previously mounted in a computer card cage comprising:

a post fixedly mounted with respect to said card cage and adapted to coact with a lateral edge portion of said first expansion board to prevent said first expansion board from unseating from said previously mounted board; and an adapter removably mounted on said post and adapted to coact with a lateral edge portion of said second expansion board to prevent said second expansion board from unseating from said previously mounted board.

18. A method for securing at least first and second generally flat, I/O expansion boards having different lateral dimension in seated electrical connection with a board previously mounted in a computer card cage comprising limiting lateral displacement of a lateral edge portion of said first expansion board with a post member so as to prevent said first expansion board from unseating from said previously mounted board and limiting lateral displacement of a lateral edge portion of said second expansion board with an adapter member mounted on said post member so as to prevent said second expansion board from unseating from said previously mounted board.

* * * * *